(12) United States Patent
Yoshikawa

(10) Patent No.: US 8,674,898 B2
(45) Date of Patent: Mar. 18, 2014

(54) BANDPASS FILTER, RADIO COMMUNICATION MODULE AND RADIO COMMUNICATION DEVICE USING THE BANDPASS FILTER

(75) Inventor: Hiromichi Yoshikawa, Kirishima (JP)

(73) Assignee: Kyocera Corporation, Kyoto (JP)

( * ) Notice: Subject to any disclaimer, the term of this patent is extended or adjusted under 35 U.S.C. 154(b) by 385 days.

(21) Appl. No.: 13/126,643

(22) PCT Filed: Sep. 30, 2009

(86) PCT No.: PCT/JP2009/067025
§ 371 (c)(1),
(2), (4) Date: Apr. 28, 2011

(87) PCT Pub. No.: WO2010/050329
PCT Pub. Date: May 6, 2010

(65) Prior Publication Data
US 2011/0205139 A1 Aug. 25, 2011

(30) Foreign Application Priority Data
Oct. 29, 2008 (JP) .................................. 2008-278115

(51) Int. Cl.
*H01Q 9/00* (2006.01)
(52) U.S. Cl.
USPC .......................................... 343/850; 343/117
(58) Field of Classification Search
USPC .................................. 343/850, 117; 333/177
See application file for complete search history.

(56) References Cited

U.S. PATENT DOCUMENTS

| | | |
|---|---|---|
| 5,489,881 A | 2/1996 | Yuda et al. |
| 5,832,578 A | 11/1998 | Yuda et al. |
| 2002/0039057 A1* | 4/2002 | Endo et al. ..................... 333/202 |
| 2006/0255885 A1 | 11/2006 | Yoshikawa et al. |

FOREIGN PATENT DOCUMENTS

| | | |
|---|---|---|
| JP | 4-88701 A | 3/1992 |
| JP | 7-30303 A | 1/1995 |
| JP | 2001-68903 A | 3/2001 |
| JP | 2006-140634 A | 6/2006 |
| JP | 2007-97113 A | 4/2007 |

* cited by examiner

*Primary Examiner* — Karl D Frech
(74) *Attorney, Agent, or Firm* — Birch, Stewart, Kolasch & Birch, LLP

(57) ABSTRACT

Provided is a bandpass filter which can cope with a wide band and has a large degree of freedom in designing a pass band. Provided also are a radio communication module and a radio communication device using the bandpass filter. The bandpass filter includes a first, a second, and a third resonator (10, 20, 30). The first and the third resonator (10, 30) have a resonance frequency f1 while the second resonator (20) has a resonance frequency f2 which is different from f1. If fe is the even-number mode resonance frequency of a resonance system formed by the first and the third resonator (10, 30) and fo is the odd-number mode resonance frequency, f2 is lower or higher than both of fe and fo. The bandpass filter has a pass band including fe, fo, and f2.

3 Claims, 6 Drawing Sheets

BANDPASS FILTER, RADIO COMMUNICATION MODULE AND RADIO COMMUNICATION DEVICE USING THE BANDPASS FILTER

TECHNICAL FIELD

The invention relates to a band-pass filter, and a wireless communication module and a wireless communication apparatus using the band-pass filter, and particularly relates to a band-pass filter that can have a wide band and has high flexibility in designing a passband, and a wireless communication module and a wireless communication apparatus using the band-pass filter.

BACKGROUND ART

In electronic apparatuses such as communication apparatuses, band-pass filters that allow only electric signals of a specific frequency to pass therethrough are used. In particular, band-pass filters are widely used in which a passband including an even mode resonance frequency and an odd mode resonance frequency is formed by using even mode resonance and odd mode resonance in a resonance system in which two resonators having the same resonance frequency are electromagnetically coupled to each other. In such band-pass filters, the difference between the even mode resonance frequency and the odd mode resonance frequency changes in response to the strength of the electromagnetic coupling between the two resonators, thereby determining the width of the passband (e.g., see Patent Literature 1).

CITATION LIST

Patent Literature

PTL 1: Japanese Unexamined Patent Application Publication No. 7-30303

SUMMARY OF INVENTION

Technical Problem

However, in the above existing band-pass filters, the passband is formed by using two resonance peaks of the even mode resonance and the odd mode resonance, and thus there is a limit on widening a band. In addition, band-pass filters are also known in which a passband is formed by using three resonance peaks based on three resonance modes in a resonance system in which three resonators having the same resonance frequency are electromagnetically coupled to each other. Such band-pass filters can have wide bands, but it is difficult to optionally and individually set the frequencies of the three resonance peaks, and flexibility in designing a passband is low.

The invention is devised in view of such problems in the existing art, and its object is to provide a band-pass filter that can have a wide band and has high flexibility in designing a passband, and a wireless communication module and a wireless communication apparatus using the band-pass filter.

Solution to Problem

The band-pass filter of the invention comprises a first resonator, a second resonator, and a third resonator that electromagnetically coupled to each other. The first resonator and the third resonator have resonant frequencies f1 equal to each other and the second resonator has a resonance frequency f2 different from f1. Where an even mode resonance frequency of a resonance system constituted of the first resonator and the third resonator is indicated by fe and an odd mode resonance frequency of the resonance system constituted of the first resonator and the third resonator is indicated by fo, the resonance frequency f2 of the second resonator is lower or higher than both fe and fo, and a passband including fe, fo, and f2 is formed by an electric signal being inputted to the first resonator and an electric signal being outputted from the third resonator.

Where: S(k12)=1 when coupling between the first resonator and the second resonator is mainly inductive; S(k12)=−1 when the coupling between the first resonator and the second resonator is mainly capacitive; S(k23)=1 when coupling between the second resonator and the third resonator is mainly inductive; S(k23)=−1 when the coupling between the second resonator and the third resonator is mainly capacitive; S(k13)=1 when coupling between the first resonator and the third resonator is mainly inductive; S(k13)=−1 when the coupling between the first resonator and the third resonator is mainly capacitive; S(δf)=−1 when f2<f1; and S(δf)=1 when f2>f1, it is satisfied that S(k12)×S(k23)×S(k13)×S(δf)=1.

According to the band-pass filter having such a configuration, since the passband is formed by using three resonance peaks located at fe, fo, and f2, a wideband band-pass filter can be obtained. In addition, since the three frequencies fe, fo, and f2 can be optionally set, a band-pass filter having high flexibility in designing a passband can be obtained. Further, according to the band-pass filter having such a configuration, between an electric signal transmitted from the first resonator directly to the third resonator and a signal transmitted from the first resonator through the second resonator to the third resonator, phase inversion does not occur at frequencies between fe, fo and f2, and phase inversion occurs at frequencies outside f2. Therefore, a band-pass filter can be obtained which has good pass characteristics in which there is no attenuation pole in the passband including fe, fo, and f2 and there is an attenuation pole in the outside of f2 that is the outside of the passband.

A wireless communication module of the invention comprises: an RF unit including the above band-pass filter of the invention; and a baseband unit connected to the RF unit.

A wireless communication apparatus of the invention comprises: an RF unit including the above band-pass filter of the invention; a baseband unit connected to the RF unit; and an antenna connected to the RF unit.

According to the wireless communication module and the wireless communication apparatus having such configurations, since the band-pass filter having low loss throughout a wide frequency band used for communication is used as a filter for communication signals, attenuation of communication signals passing through the band-pass filter is reduced. Therefore, a high-performance wireless communication module and wireless communication apparatus having high receiving sensitivity can be obtained.

Advantageous Effects of Invention

According to the band-pass filter of the invention, a band-pass filter that can have a wide band and has high flexibility in designing a passband can be obtained.

DESCRIPTION OF EMBODIMENTS

Hereinafter, a band-pass filter of the invention, and a wireless communication module and a wireless communication apparatus using the band-pass filter will be described in detail with reference to the accompanying drawings.

First Example of Embodiment

Figure 1:
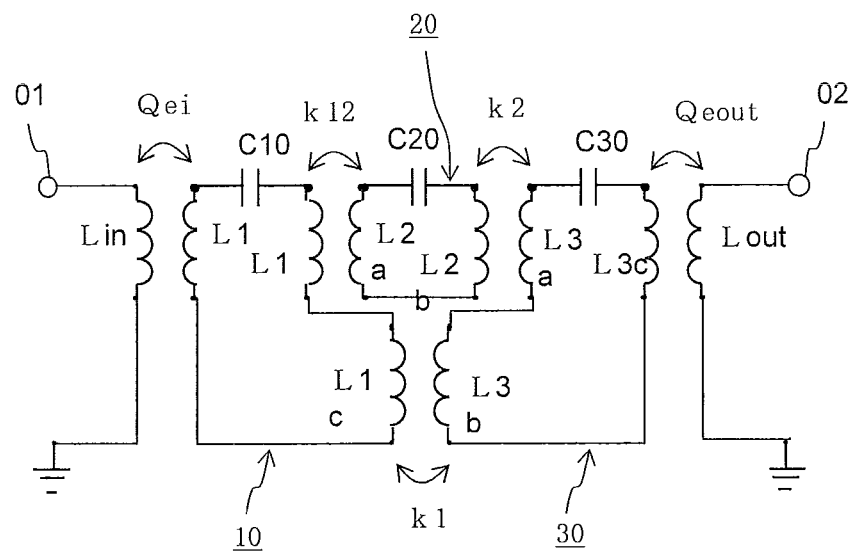
FIG. 1 is an equivalent circuit diagram schematically showing a band-pass filter of a first example of embodiment of the invention.

FIG. 1 is an equivalent circuit diagram showing a band-pass filter of a first example of embodiment of the invention. As shown in FIG. 1, in the band-pass filter of the example, a first resonator 10 is constituted of a series circuit of inductors L1$a$, L1$b$, and L1$c$ and a capacitor C10. A second resonator 20 is constituted of a series circuit of inductors L2$a$ and L2$b$ and a capacitor C20. A third resonator 30 is constituted of a series circuit of inductors L3$a$, L3$b$, and L3$c$ and a capacitor C30. The first resonator 10 and the second resonator 20 are electromagnetically coupled to each other with a coupling coefficient k12. The second resonator 20 and the third resonator 30 are electromagnetically coupled to each other with a coupling coefficient k23. The first resonator 10 and the third resonator 30 are electromagnetically coupled to each other with a coupling coefficient k13. Note that when the sign of each of k12, k23, and k13 is positive, it indicates inductive coupling, and when the sign of each of k12, k23, and k13 is negative, it indicates capacitive coupling. In addition, an input terminal 01 is grounded through an inductor Lin. An output terminal 02 is grounded through an inductor Lout. The first resonator 10 is electromagnetically coupled to the inductor Lin. The third resonator 30 is electromagnetically coupled to the inductor Lout.

Further, the first resonator 10 and the third resonator 30 have resonant frequencies f1 equal to each other, and the second resonator 20 has a resonance frequency f2 different from f1. Where an even mode resonance frequency of a resonance system constituted of the first resonator 10 and the third resonator 30 is indicated by fe and an odd mode resonance frequency of the resonance system constituted of the first resonator 10 and the third resonator 30 is indicated by fo, the resonance frequency f2 of the second resonator 20 is set so as to be lower or higher than both fe and fo. In other words, on a frequency axis, f2 is located not between fe and fo but outside between fe and fo. An electric signal is inputted from the input terminal 01 through the inductor Lin to the first resonator 10, and an electric signal is outputted from the third resonator 30 through the inductor Lout, whereby a passband including fe, fo, and f2 is formed.

According to the band-pass filter of the example having such a configuration, since the passband is formed by using three resonance peaks located at fe, fo, and f2, a wideband band-pass filter can be obtained. In addition, since the three frequencies fe, fo, and f2 can be optionally set, a band-pass filter having high flexibility in designing a passband can be obtained.

Further, according to the band-pass filter of the example, where: S(k12)=1 when the coupling between the first resonator 10 and the second resonator 20 is mainly inductive; S(k12)=−1 when the coupling between the first resonator 10 and the second resonator 20 is mainly capacitive; S(k23)=1 when the coupling between the second resonator 20 and the third resonator 30 is mainly inductive; S(k23)=−1 when the coupling between the second resonator 20 and the third resonator 30 is mainly capacitive; S(k13)=1 when the coupling between the first resonator 10 and the third resonator 30 is mainly inductive; S(k13)=−1 when the coupling between the first resonator 10 and the third resonator 30 is mainly capacitive; S($\delta$f)=−1 when f2<f1; and S($\delta$f)=1 when f2>f1, it is satisfied that S(k12)×S(k23)×S(k13)×S($\delta$f)=1. By so doing, between an electric signal transmitted from the first resonator 10 directly to the third resonator 30 and a signal transmitted from the first resonator 10 through the second resonator 20 to the third resonator 30, phase inversion does not occur at frequencies in the passband between fe, fo and f2, and phase inversion occurs at frequencies in the outside of f2 that is the outside of the passband. Therefore, a band-pass filter can be obtained which has good pass characteristics in which there is no attenuation pole in the passband including fe, fo and f2 and there is an attenuation pole in the outside of f2 that is the outside of the passband. Note that in the band-pass filter of the example, the magnitudes (absolute values) of the coupling coefficient k12 between the first resonator 10 and the second resonator 20, the coupling coefficient k23 between the second resonator 20 and the third resonator 30, and the coupling coefficient k13 between the first resonator 10 and the third resonator 30 are desirably set so as to be substantially equal to each other. By so doing, it is possible to form a desired passband.

As a result of various considerations, the inventor has derived such conditions for obtaining pass characteristics in which there is no attenuation pole in the passband including fe, fo and f2 and there is an attenuation pole in the outside of f2 that is the outside of the passband. The mechanism by which the effect is obtained is inferred as follows by a consideration with a series of circuit simulations conducted by the inventor.

In other words, in the band-pass filter of the example, an electric signal transmitted from the first resonator 10 directly to the third resonator 30 and a signal transmitted from the first resonator 10 through the second resonator 20 to the third resonator 30 exist. Here, in a frequency region located in the outside of the even mode resonance frequency fe and the odd mode resonance frequency fo of the resonance system constituted of the first resonator 10 and the third resonator 30, a transmission route of the electric signal transmitted from the first resonator 10 directly to the third resonator 30 is equivalent to an inductor when the first resonator 10 and the third resonator 30 are mainly inductively coupled to each other, and is equivalent to a capacitor when the first resonator 10 and the third resonator 30 are mainly capacitively coupled to each other.

A transmission route of the electric signal transmitted from the first resonator 10 through the second resonator 20 to the third resonator 30 is equivalent to an inductor on the lower frequency side of the resonance frequency f2 of the second resonator 20, and is equivalent to a capacitor on the higher frequency side of f2, when both of the main coupling between the first resonator 10 and the second resonator 20 and the main coupling between the second resonator 20 and the third resonator 30 are inductive or capacitive. In addition, the transmission route of the electric signal transmitted from the first resonator 10 through the second resonator 20 to the third resonator 30 is equivalent to a capacitor on the lower frequency side of the resonance frequency f2 of the second resonator 20, and is equivalent to an inductor on the higher frequency side of f2, when either one of the main coupling between the first resonator 10 and the second resonator 20 or the main coupling between the second resonator 20 and the third resonator 30 is inductive coupling and the other one is capacitive coupling.

Therefore, it is recognized that the two signal transmission routes, that is, the transmission route of the signal transmitted from the first resonator 10 directly to the third resonator 30 and the transmission route of the signal transmitted from the first resonator 10 through the second resonator 20 to the third resonator 30, only need to be set as follows.

First, the case will be considered where the coupling between the first resonator 10 and the third resonator 30 is mainly inductive coupling and both of the main coupling between the first resonator 10 and the second resonator 20 and the main coupling between the second resonator 20 and the third resonator 30 are inductive coupling or capacitive coupling. In the case, the resonance frequency f2 of the second resonator 20 is set so as to be higher than the resonant frequencies f1 of the first resonator 10 and the second resonator 20. More precisely, f2 is set so as to be higher than both fe and fo. By so doing, phase inversion does not occur between electric signals having passed through the two signal transmission routes in the passband including fe, fo, and f2, and phase inversion occurs between electric signals having passed through the two signal transmission routes on the higher frequency side of f2 that is the outside of the passband. Therefore, a band-pass filter can be obtained which has good pass characteristics in which there is no attenuation pole in the passband including fe, fo, and f2 and there is an attenuation pole on the higher frequency side of f2 that is the outside of the passband.

Next, the case will be considered where the coupling between the first resonator 10 and the third resonator 30 is mainly inductive coupling, either one of the main coupling between the first resonator 10 and the second resonator 20 or the main coupling between the second resonator 20 and the third resonator 30 is inductive coupling, and the other one is capacitive coupling. In the case, the resonance frequency f2 of the second resonator 20 is set so as to be lower than the resonant frequencies f1 of the first resonator 10 and the second resonator 20. More precisely, f2 is set so as to be lower than both fe and fo. By so doing, phase inversion does not occur between electric signals having passed through the two signal transmission routes in the passband including fe, fo, and f2, and phase inversion occurs between electric signals having passed through the two signal transmission routes on the lower frequency side of f2 that is the outside of the passband. Therefore, a band-pass filter can be obtained which has good pass characteristics in which there is no attenuation pole in the passband including fe, fo, and f2 and there is an attenuation pole on the lower frequency side of f2 that is the outside of the passband.

Next, the case will be considered where the coupling between the first resonator 10 and the third resonator 30 is mainly capacitive coupling and both the main coupling between the first resonator 10 and the second resonator 20 and the main coupling between the second resonator 20 and the third resonator 30 are inductive coupling or capacitive coupling. In the case, the resonance frequency f2 of the second resonator 20 is set so as to be lower than the resonant frequencies f1 of the first resonator 10 and the second resonator 20. More precisely, f2 is set so as to be lower than both fe and fo. By so doing, phase inversion does not occur between electric signals having passed through the two signal transmission routes in the passband including fe, fo, and f2, and phase inversion occurs between electric signals having passed through the two signal transmission routes on the lower frequency side of f2 that is the outside of the passband. Therefore, a band-pass filter can be obtained which has good pass characteristics in which there is no attenuation pole in the passband including fe, fo, and f2 and there is an attenuation pole on the lower frequency side of f2 that is the outside of the passband.

Next, the case will be considered where the coupling between the first resonator 10 and the third resonator 30 is mainly capacitive coupling, either one of the main coupling between the first resonator 10 and the second resonator 20 or the main coupling between the second resonator 20 and the third resonator 30 is inductive coupling, and the other one is capacitive coupling. In the case, the resonance frequency f2 of the second resonator 20 is set so as to be higher than the resonant frequencies f1 of the first resonator 10 and the second resonator 20. More precisely, f2 is set so as to be higher than both fe and fo. By so doing, phase inversion does not occur between electric signals having passed through the two signal transmission routes in the passband including fe, fo, and f2, and phase inversion occurs between electric signals having passed through the two signal transmission routes on the higher frequency side of f2 that is the outside of the passband. Therefore, a band-pass filter can be obtained which has good pass characteristics in which there is no attenuation pole in the passband including fe, fo, and f2 and there is an attenuation pole on the higher frequency side of f2 that is the outside of the passband.

To summarize, it is recognized that it is only necessary to satisfy that $S(k12) \times S(k23) \times S(k13) \times S(\delta f) = 1$, where: $S(k12)=1$ when the coupling between the first resonator 10 and the second resonator 20 is mainly inductive; $S(k12)=-1$ when the coupling between the first resonator 10 and the second resonator 20 is mainly capacitive; $S(k23)=1$ when the coupling between the second resonator 20 and the third resonator 30 is mainly inductive; $S(k23)=-1$ when the coupling between the second resonator 20 and the third resonator 30 is mainly capacitive; $S(k13)=1$ when the coupling between the first resonator 10 and the third resonator 30 is mainly inductive; $S(k13)=-1$ when the coupling between the first resonator 10 and the third resonator 30 is mainly capacitive; $S(\delta f)=-1$ when $f2<f1$; and $S(\delta f)=1$ when $f2>f1$.

Second Example of Embodiment

Figure 2:
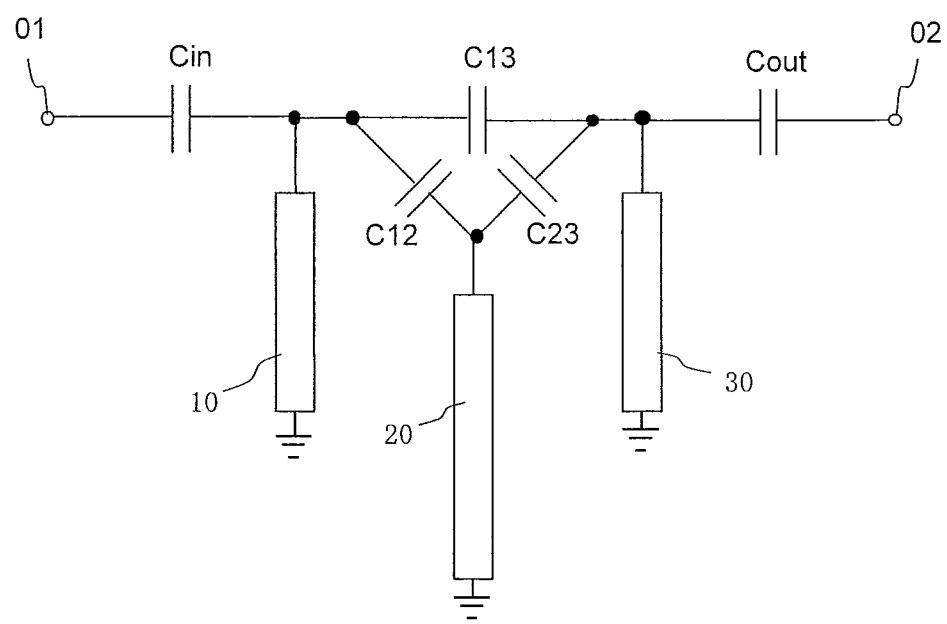
FIG. 2 is an equivalent circuit diagram schematically showing a band-pass filter of a second example of embodiment of the invention.

FIG. 2 is an equivalent circuit diagram showing a band-pass filter of a second example of embodiment of the invention. Note that only the difference from the first example described above will be described in the example, the same reference signs are used for like components, and the overlap description is omitted.

The band-pass filter of the example is one specific circuit example of the general equivalent circuit shown in FIG. 1. In the band-pass filter of the example, each of a first resonator 10, a second resonator 20, and a third resonator 30 is constituted of a ¼ wavelength line having a grounded end. Electromagnetic coupling k12 between the first resonator 10 and the second resonator 20 is constituted of a capacitor C12. Electromagnetic coupling k23 between the second resonator 20 and the third resonator 30 is constituted of a capacitor C23.

Electromagnetic coupling k13 between the first resonator 10 and the third resonator 30 is constituted of a capacitor C13. Coupling Qein between an input terminal 01 and the first resonator 10 is constituted of a capacitor Cin. Coupling Qeout between an output terminal 02 and the third resonator 30 is constituted of a capacitor Cout. The length of the second resonator 20 is set so as to be longer than the lengths of the first resonator 10 and the second resonator 20. By so doing, the resonance frequency f2 of the second resonator 20 is set so as to be lower than the resonant frequencies f1 of the first resonator 10 and the third resonator 30.

In the band-pass filter of the example having such a configuration, since all of k12, k23, and k13 are capacitive and f2<f1, it is satisfied that $S(k12) \times S(k23) \times S(k13) \times S(\delta f) = -1 \times -1 \times -1 \times -1 = 1$. Thus, in the passband including fe, fo, and f2, phase inversion does not occur between an electric signal transmitted from the first resonator 10 directly to the third resonator 30 and an electric signal transmitted from the first resonator 10 through the second resonator 20 to the third resonator 30. On the lower frequency side of f2, phase inversion occurs between an electric signal transmitted from the first resonator 10 directly to the third resonator 30 and an electric signal transmitted from the first resonator 10 through the second resonator 20 to the third resonator 30. Therefore, a band-pass filter can be obtained which has good pass characteristics in which there is no attenuation pole in the passband including fe, fo, and f2 and there is an attenuation pole on the lower frequency side of f2 that is the outside of the passband.

Third Example of Embodiment

Figure 3:
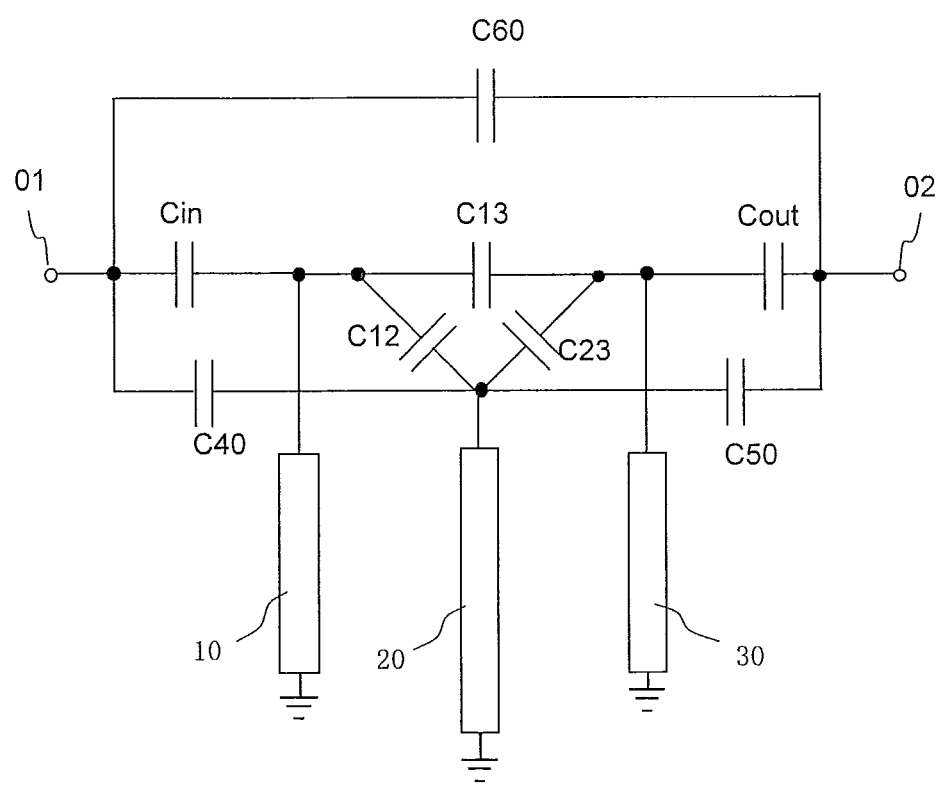
FIG. 3 is an equivalent circuit diagram schematically showing a band-pass filter of a third example of embodiment of the invention.

FIG. 3 is a circuit diagram showing a band-pass filter of a third example of embodiment of the invention. Note that only the difference from the second example described above will be described in the example, the same reference signs are used for like components, and the overlap description is omitted.

In the band-pass filter of the example, as shown in FIG. 3, an input terminal 01 and a second resonator 20 are connected to each other through a capacitor C40, the second resonator 20 and an output terminal 02 are connected to each other through a capacitor C50, and the input terminal 01 and the output terminal 02 are connected to each other through a capacitor C60.

According to the band-pass filter of the example having such a configuration, in the pass characteristics of the band-pass filter, phase inversion occurs between an electric signal transmitted from a first resonator 10 directly to a third resonator 30 and an electric signal transmitted from the first resonator 10 through the second resonator 20 to the third resonator 30, whereby two attenuation poles can be newly formed on the lower frequency side of the attenuation pole formed on the lower frequency side of the resonance frequency f2 of the second resonator 20. Therefore, a band-pass filter having better attenuation characteristics on the lower frequency side of the passband can be obtained.

Fourth Example of Embodiment

Figure 4:
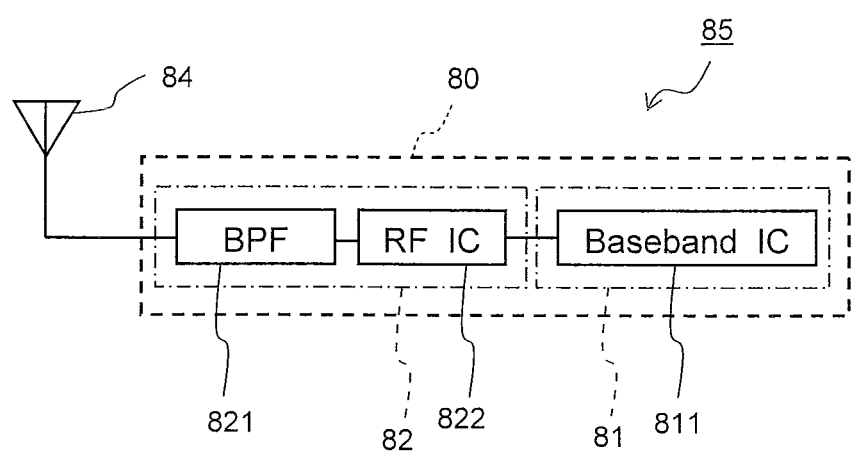
FIG. 4 is a block diagram schematically showing a wireless communication module and a wireless communication apparatus of a fourth example of embodiment of the invention.

FIG. 4 is a block diagram showing a wireless communication module 80 and a wireless communication apparatus 85 of a fourth example of embodiment of the invention.

The wireless communication module 80 of the example includes a baseband unit 81 by which a baseband signal is processed, and an RF unit 82 that is connected to the baseband unit 81 and by which an RF signal that is after modulation of the baseband signal and before demodulation of the baseband signal is processed. The RF unit 82 includes a band-pass filter 821 described above. In the RF unit 82, signals in an RF signal obtained by modulating the baseband signal or in a received RF signal and out of a communication band are attenuated by the band-pass filter 821.

As a specific configuration, a baseband IC 811 is provided in the baseband unit 81, and an RF IC 822 is provided in the RF unit 82 and between the band-pass filter 821 and the baseband unit 81. Note that another circuit may be interposed between these circuits. An antenna 84 is connected to the band-pass filter 821 of the wireless communication module 80, whereby the wireless communication apparatus 85 is configured to transmit/receive RF signals.

According to the wireless communication module 80 and the wireless communication apparatus 85 of the example having such a configuration, since the band-pass filter 821 having low loss throughout a wide frequency band used for communication is used as a filter for communication signals, attenuation of communication signals passing through the band-pass filter 821 is reduced and noise is also decreased. Thus, since the receiving sensitivity improves and the amplification degrees of transmission signals and reception signals can be reduced, the power consumption of an amplifier circuit is reduced. Therefore, the high-performance wireless communication module 80 and wireless communication apparatus 85 having high receiving sensitivity and low power consumption can be obtained.

Modified Examples

The invention is not limited to the first to fourth examples of embodiment described above, and various changes and modifications can be made without departing from the gist of the invention.

For example, in the second and third examples of embodiment described above, the ¼ wavelength lines are used as the first resonator 10, the second resonator 20, and the third resonator 30, but the first resonator 10, the second resonator 20, and the third resonator 30 are not limited thereto. For example, linear resonators, such as ½ wavelength resonators using micro-strip lines, strip lines, and the like and ring resonators, can be used. In addition, planar resonators, such as dual-mode square resonators and dual-mode circular resonators, can be used. Further, solid resonators and the like, such as dielectric resonators having columnar shapes, rectangular parallelepiped shapes, ring shapes, and the like and coaxial resonators, can be used.

EXAMPLES

Next, specific examples of the band-pass filter of the invention will be described.

Electrical characteristics of the band-pass filter of the second example of embodiment of the invention shown in FIG. 2 are calculated by a simulation. The first resonator 10, the second resonator 20, and the third resonator 30 are formed by using strip lines. The relative dielectric constant of a dielectric substance is set to 18.7. The interval between upper and lower ground conductors is set to 1 mm. The width of each strip line is set to 0.2 mm. The length of each of the strip lines constituting the first resonator 10 and the third resonator 30 is set to 5.4 mm. The length of the strip line constituting the second resonator 20 is set to 6.85 mm. Each of the capacitors Cin and Cout is set to have a capacitance of 0.6 pF. Each of the capacitors C12, C23, and C13 is set to have a capacitance of 0.15 pF.

Figure 5:
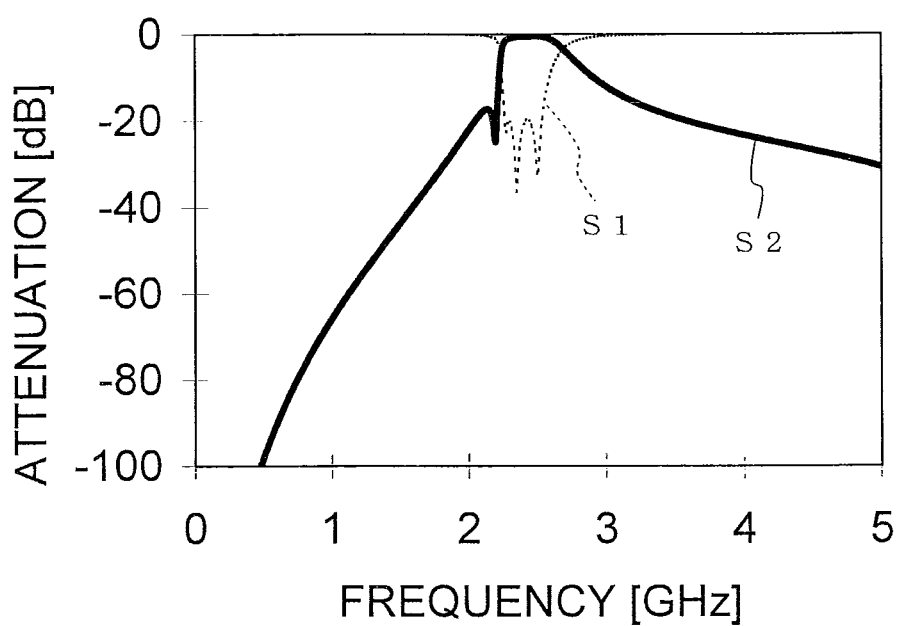
FIG. 5 is a diagram showing a simulation result of electrical characteristics of the band-pass filter of the second example of embodiment of the invention.

FIG. 5 is a graph showing the simulation result. In the graph, the horizontal axis indicates frequency, and the vertical axis indicates attenuation amount. In addition, the graph in FIG. 5 shows the pass characteristics (S21) and the reflection characteristics (S11) of the band-pass filter when the input terminal 01 is a port 1 and the output terminal 02 is a port 2. According to the graph shown in FIG. 5, it is recognized that good filter characteristics are obtained in which a flat and wide passband having low loss is formed by using three resonance peaks, an attenuation pole is formed on the lower frequency side of the passband and near the passband, and the attenuation amount greatly changes from an attenuation band to the passband. Thus, effectiveness of the invention can be verified.

Further, electrical characteristics of the band-pass filter of the third example of embodiment of the invention shown in FIG. 3 are calculated by a simulation. The first resonator 10, the second resonator 20, and the third resonator 30 are formed by using strip lines. The relative dielectric constant of a dielectric substance is set to 18.7. The interval between upper and lower ground conductors is set to 1 mm. The width of each strip line is set to 0.2 mm. The length of each of the strip lines constituting the first resonator 10 and the third resonator 30 is set to 5.4 mm. The length of the strip line constituting the second resonator 20 is set to 6.9 mm. Each of the capacitors Cin and Cout is set to have a capacitance of 0.6 pF. Each of the capacitors C12, C23, and C13 is set to have a capacitance of 0.15 pF. Each of the capacitors C40 and C50 is set to have a capacitance of 0.02 pF. The capacitor C60 is set to have a capacitance of 0.001 pF.

Figure 6:
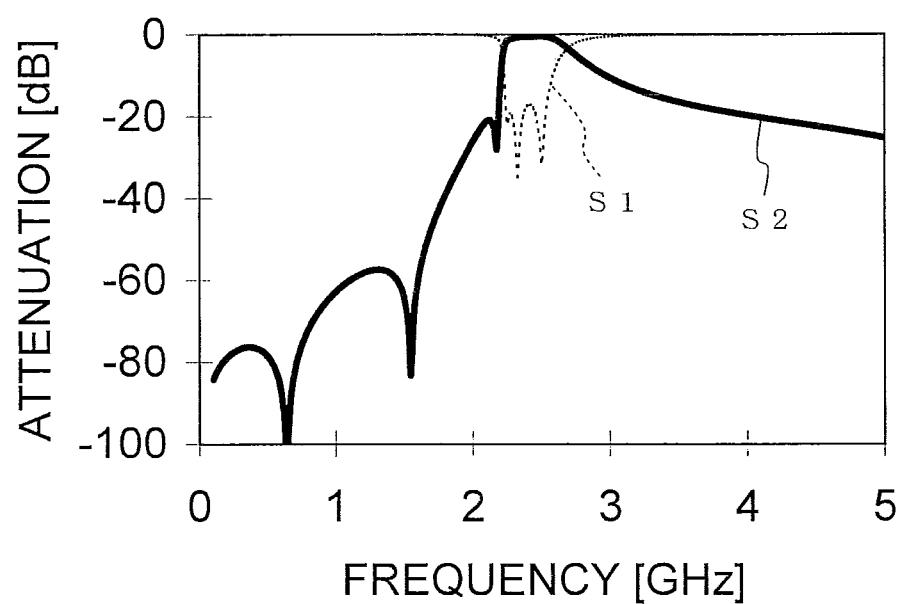
FIG. 6 is a diagram showing a simulation result of electrical characteristics of the band-pass filter of the third example of embodiment of the invention.

FIG. 6 is a graph showing the simulation result. In the graph, the horizontal axis indicates frequency, and the vertical axis indicates attenuation amount. In addition, the graph in FIG. 6 shows the pass characteristics (S21) and the reflection characteristics (S11) of the band-pass filter when the input terminal 01 is a port 1 and the output terminal 02 is a port 2. According to the graph shown in FIG. 6, it is recognized that two attenuation poles are further formed on the lower frequency side of the passband, and the attenuation amount is improved on the lower frequency side of the passband, and better filter characteristics are obtained.

REFERENCE SIGNS LIST 10 first resonator
20 second resonator
30 third resonator
80 wireless communication module
81 baseband unit
82 RF unit
84 antenna
85 wireless communication apparatus

The invention claimed is:

1. A band-pass filter comprising a first resonator, a second resonator, and a third resonator that electromagnetically coupled to each other, wherein
the first resonator and the third resonator have resonant frequencies f1 equal to each other and the second resonator has a resonance frequency f2 different from f1,
where an even mode resonance frequency of a resonance system constituted of the first resonator and the third resonator is indicated by fe and an odd mode resonance frequency of the resonance system constituted of the first resonator and the third resonator is indicated by fo, the resonance frequency f2 of the second resonator is lower or higher than both fe and fo, and a passband including fe, fo, and f2 is formed by an electric signal being inputted to the first resonator and an electric signal being outputted from the third resonator, and
where: $S(k12)=1$ when coupling between the first resonator and the second resonator is mainly inductive; $S(k12)=-1$ when the coupling between the first resonator and the second resonator is mainly capacitive; $S(k23)=1$ when coupling between the second resonator and the third resonator is mainly inductive; $S(k23)=-1$ when the coupling between the second resonator and the third resonator is mainly capacitive; $S(k13)=1$ when coupling between the first resonator and the third resonator is mainly inductive; $S(k13)=-1$ when the coupling between the first resonator and the third resonator is mainly capacitive; $S(\delta f)=-1$ when $f2<f1$; and $S(\delta f)=1$ when $f2>f1$, it is satisfied that $S(k12) \times S(k23) \times S(k13) \times S(\delta f)=1$.

2. A wireless communication module comprising: an RF unit including a band-pass filter according to claim 1; and a baseband unit connected to the RF unit.

3. A wireless communication apparatus comprising: an RF unit including a band-pass filter according to claim 1; a baseband unit connected to the RF unit; and an antenna connected to the RF unit.

* * * * *